US005841706A

United States Patent [19]
Umezaki et al.

[11] Patent Number: 5,841,706
[45] Date of Patent: Nov. 24, 1998

[54] SEMICONDUCTOR MEMORY DEVICE CAPABLE OF HIGH SPEED OPERATION IN LOW POWER SUPPLY VOLTAGE

[75] Inventors: Nobuyuki Umezaki; Francis Matthews, both of Tokyo, Japan

[73] Assignee: NEC Corporation, Tokyo, Japan

[21] Appl. No.: 799,996

[22] Filed: Feb. 13, 1997

[30] Foreign Application Priority Data

Feb. 28, 1996 [JP] Japan ................................ 8-041159

[51] Int. Cl.$^6$ ................................................ G11C 7/00
[52] U.S. Cl. ............................ 365/189.11; 365/189.09
[58] Field of Search ........................ 365/228, 189.09, 365/226, 230.06, 189.11

[56] References Cited

U.S. PATENT DOCUMENTS 5,249,156  9/1993  Hagiwara et al. ........................ 365/228
5,384,745  1/1995  Konishi et al. ...................... 365/230.03

*Primary Examiner*—David Nelms
*Assistant Examiner*—Michael T. Tran
*Attorney, Agent, or Firm*—Whitham, Curtis & Whitham

[57] ABSTRACT

A semiconductor memory device includes a memory cell array which is composed of a plurality of memory cells arranged in a matrix manner. Each of rows of the memory cell array is connected to a word line and each of columns of the memory cell array is connected to a pair of bit lines, and one of the word lines and one of the pairs of bit lines are selected in accordance with an address such that one of the plurality of memory cells is selected. An internal signal generating section generates a first activation signal in response to input of the address, and a power supply voltage detecting section determines whether a power supply voltage is higher than a predetermined voltage and generates a voltage detection signal when the power supply voltage is higher than the predetermined voltage. The selected word line is normally set to the power supply voltage and is set to a boosted voltage in response to the voltage detection signal. The boosted voltage is higher than the power supply voltage. A timing control section receives the first activation signal and generates a second activation signal at a timing which is determined based on the voltage detection signal from the power supply voltage detecting section, and a sense amplifier section is responsive to the second activation signal to amplify potentials on the bit lines associated with the selected memory cell and to output the amplifying result as a data stored in the selected memory cell.

16 Claims, 8 Drawing Sheets

SEMICONDUCTOR MEMORY DEVICE CAPABLE OF HIGH SPEED OPERATION IN LOW POWER SUPPLY VOLTAGE

BACKGROUND OF THE INVENTION

1. Field of the Invention

The present invention relates to a semiconductor memory device, and more particularly to a semiconductor memory device which can perform a read operation at high speed in a low power supply voltage.

2. Description of Related Art

In recent years, the technique of forming fine patterns for semiconductor elements has been developed remarkably and the high integration and the high speed operation have also proceeded even in a semiconductor memory device such as a static random access memory (hereinafter, to be referred to as an "SRAM"). In such a semiconductor memory device, also, a low power supply voltage operation is required with the requirement of low power consumption. That is, it is necessary that the semiconductor memory device can operate correctly in the wide range of power supply voltages. For this purpose, a word line boosting circuit is generally adopted.

FIG. 1 is a block diagram illustrating the structure of a conventional SRAM which has a word line boosting circuit. Referring to FIG. 1, a memory cell array is composed of a plurality of memory cells 16 arranged in a matrix manner and each row of the memory cell array is connected to a word line and each column of the memory cell array is connected to a pair of bit lines 18 and 19. An address signal AX is supplied from outside to an X address decoder 12 through address buffers 8. The X address decoder 12 selects one of the word lines in accordance with the X address. The bit lines 18 and 19 of each pair are connected to the data input/output terminals of each of the memory cells 16. A pair of load transistors 15 are provided for one end of each pair of bit lines 18 and 19 and are set to the conductive state in response to a precharge signal 107 as an internal signal which is supplied from an internal signal generating circuit 11. The voltage ($V_{CC}$-$V_{th}$) lower is by the threshold voltage $V_{th}$ of the load transistor 15 than a power supply voltage $V_{cc}$ is supplied to each pair of bit lines 18 and 19 as a precharge voltage.

In the read operation, a data read out from a memory cell 16 which is selected by a selected word line and a selected pair of bit lines is outputted to a sense amplifier 22 through transfer gates 20 and 21, and is outputted from the sense amplifier 22 to an input/output pin 26 through an output buffer 23. On the other hand, in the write operation, a write data is supplied to a writing circuit 24 through the input/output pin 26 and a data input buffer 25, and is supplied from the writing circuit 24 to the pair of bit lines 18 and 19 through the transfer gates 20 and 21.

A Y address decoder 14 decodes a Y address signal which is supplied through Y address buffers 9, and set the transfer gates 20 and 21 connected to each of the pairs of bit lines to the conductive state or non-conductive state to select one of the columns of the memory cell array. The sense amplifier 22 is activated based on a sense amplifier activation signal SE 102 which is generated by a sense amplifier activation signal generating circuit 1 in response to a sense amplifier activation preliminary signal 101 as an internal signal from the internal signal generating circuit 11. The output signal of a power supply voltage detection circuit 7 is supplied to the word line boosting circuit 13, and the word line boosting circuit 13 boosts the voltage of the selected word line to the voltage of ($V_{cc}$+α) in response to this signal and a boosting circuit activation signal 109 as an internal signal from the internal signal generating circuit 11 when the power supply voltage is equal to or less than 3 V.

A one-shot pulse generating circuit 10 generates a one-shot pulse signal in response to the address signals AX and AY which are supplied from the X address buffers 8 and Y address buffers 9, and the internal signal generating circuit 11 generates the above-mentioned internal signals in response to the one-shot pulse signal.

FIG. 2 is a circuit diagram of the sense amplifier activation signal generating circuit 1. Referring to FIG. 2, this circuit is composed of an inverter circuit 3 which includes a plurality of inverters connected in serial. The generating circuit 1 receives a sense amplifier activation preliminary signal SE* ("*" indicates an inverted signal) 101 which is generated by the internal signal generating circuit 11, and generates the sense amplifier activation signal SE 102 at the time when the potential difference between the bit lines 18 and 19 is made sufficiently large.

In the SRAM having the above-mentioned structure, consider a relation of the potential difference ΔV between the bit lines 18 and 19 and the generation timing of the sense amplifier activation signal SE 102 in case of read operation.

FIG. 3A is a timing chart illustrating the voltage change of the word line 17 when the power supply voltage is 5 V in a usual manner. FIG. 3B is a timing chart illustrating the waveform of the potential differences ΔV between the bit lines 18 and 19 and the waveform of the signal SE 102. Referring to FIGS. 3A and 3B, the potentials between the bit lines 18 and 19 starts to be separated at the timing tf with a predetermined time period after the word line 17 is activated to the high level at a timing ta. Then, the sense amplifier activation signal SE 102 is outputted at the timing tg when the potential difference ΔV becomes wide to a required level such that the sense amplifier 22 can amplify the potential difference without any erroneous operation. As a result, the access time can be reduced.

Next, FIG. 4A is a timing chart illustrating the voltage waveform of the word line 17 when the word line boosting circuit 13 is not used and the power supply voltage is the low power supply voltage of 2.5 V. FIG. 4B is a timing chart illustrating the waveform of the potential difference ΔV between the bit lines 18 and 19 and the waveform of the sense amplifier activation signal SE 102. Referring to FIGS. 4A and 4B, in case of the power supply voltage of 2.5 V, the driving capability of all the transistors in the SRAM decreases rapidly, compared to the case of the power supply voltage of 5 V. For this reason, the timing tb when the word line 17 is activated, the timing th when the potentials between the bit lines 18 and 19 starts to be separated, and the timing ti when the sense amplifier activation signal SE 102 is generated are all delayed in such a manner of tf→th and tg→ti, compared to the case of the power supply voltage of 5 V. Also, the timing tg or ti (the timing tg is earlier than the timing ti) when the sense amplifier activation signal SE 102 is generated is the timing that the potential difference between the bit lines 18 and 19 has been made wide to the level equal to or larger than a voltage required for the sense amplification. Therefore, in this example, the timing ti does not have an excess margin.

However, in a case where the word line boosting circuit 13 is not used when the power supply voltage is 2.5 V, the high level of the information which has been written in the selected memory cell 16 is the voltage ($V_{cc}$ - $V_{th}$) which is lower by the threshold voltage ($V_{th}$) of the transfer gate than the power supply voltage $V_{cc}$. For this reason, there is a possibility that the inversion of the memory cell information occurs in the read operation. Therefore, generally, in the low power supply voltage operation, the word line boosting circuit 13 is activated, and the potential of the word line 17 is boosted to a voltage of $(V_{cc}+\alpha)$ higher by a predetermined voltage a than the power supply voltage $V_{cc}$. Thereby, the high level of the information which has been written in the selected memory cell 16 is approximately maintained to the power supply voltage $V_{cc}$ and the inversion of the memory cell information is prevented.

FIG. 5A is a timing chart illustrating the voltage waveform of the word line 17 when the word line boosting circuit 13 is used in the power supply voltage of 2.5 V. FIG. 5B is a timing chart illustrating the waveform of potential difference $\Delta V$ between the bit lines 18 and 19 and the waveform of the sense amplifier activation signal SE 102 at that time. Referring to FIGS. 5A and 5B, the generation timing tk of the sense amplifier activation signal SE 102 is substantially the same as in the case where the word line boosting circuit is not used. However, since the word line is boosted to the voltage of $(V_{cc}+\alpha)$, it would be understood that the timing tj when the potentials between the bit lines 18 and 19 starts to be separated earlier, compared to the case where the word line boosting circuit 13 is not used.

As described above, in the read operation of the conventional SRAM in the low power supply voltage equal to or less than 3 V, when the word line boosting circuit 13 is used, the sense amplifier activation signal SE 102 is not generated even if the potential difference between the bit lines 18 and 19 becomes wide to the required level, as shown in FIGS. 5A and 5B. For this reason, the delay of the generation of the sense amplifier activation signal SE 102 appears as the delay of the read time, just as it is. Therefore, in order to achieve a high speed access time in either case of a usual power supply voltage (5V) and a low power supply voltage (equal to or less than 3 V), the SRAM is required to have the sense amplifier activation signal generating circuit which can generate the signal SE 102 earlier in accordance with the separation of the potentials between the bit lines 18 and 19.

SUMMARY OF THE INVENTION

The present invention is made in the light of the above-mentioned problems. An object the present invention is to provide a semiconductor memory device in which the timing of generation of a sense amplifier activation signal can be adjusted to the timing when the potential difference between bit lines of a pair becomes wide to a required level in case of low voltage operation so that the high speed data access can be achieved.

Another object the present invention is to provide a semiconductor memory device and an access method in which the timings of generation of activation signals of the semiconductor memory device can be adjusted based on the power supply voltage.

In order to achieve an aspect of the present invention, a semiconductor memory device includes a memory cell array which is composed of a plurality of memory cells arranged in a matrix manner, wherein each of rows of the memory cell array is connected to a word line and each of columns of the memory cell array is connected to a pair of bit lines, and wherein one of the word lines and one of the pairs of bit lines are selected in accordance with an address such that one of the plurality of memory cells is selected, an internal signal generating section for generating a first activation signal in response to input of the address, a power supply voltage detecting section for determining whether a power supply voltage is higher than a predetermined voltage and generating a voltage detection signal when the power supply voltage is higher than the predetermined voltage, wherein the selected word line is normally set to the power supply voltage and is set to a boosted voltage in response to the voltage detection signal, the boosted voltage being higher than the power supply voltage, a timing control section for receiving the first activation signal and generating a second activation signal at a timing which is determined based on the voltage detection signal from the power supply voltage detecting section, and a sense amplifier section responsive to the second activation signal, for amplifying potentials on the bit lines associated with the selected memory cell and outputting the amplifying result as a data stored in the selected memory cell.

In this case, the timing control section generates the second activation signal immediately after receiving the first activation signal when the power supply voltage is not higher than the predetermined voltage, and by a predetermined time period after receiving the first activation signal when the power supply voltage is higher than the predetermined voltage. More particularly, the timing control section includes a delay circuit for receiving the first activation signal and delaying the first activation signal by the predetermined time period, a first circuit for inactivating the delayed first activation signal in response to the voltage detection signal, and a second circuit for receiving the first activation signal and outputting, as the second activation signal, the delayed first activation signal if the delayed first activation signal is active and the received first activation signal if the delayed first activation signal is inactivated.

In order to achieve another aspect of the present invention, a semiconductor memory device includes a memory cell array which is composed of a plurality of memory cells arranged in a matrix manner, wherein each of rows of the memory cell array is connected to a word line and each of columns of the memory cell array is connected to a pair of bit lines, a bit line pair selecting section for selecting one of the pairs of bit lines in accordance with the address, a precharging section for precharging at least the selected pair of bit lines, a word line driving section for selecting one of the word lines in accordance with the address and selectively driving the selected word line to one of a power supply voltage and a boosted voltage in accordance with a voltage detection signal, the boosted voltage being higher than the power supply voltage, a sense amplifier section for amplifying potentials on the bit lines of the selected pair and outputting the amplifying result as a data stored in a memory cell associated with the selected word line and the selected pair of bit lines, a power supply voltage detecting section for determining the power supply voltage to generate the voltage detection signal, and a timing control section for selectively activating at least one section of the precharging section, the word line driving section, and the sense amplifier section at a corresponding first timing in accordance with the voltage detection signal, the remaining being activated at a corresponding second timing later than the first timing.

In order to achieve still another aspect of the present invention, a method of accessing a semiconductor memory device, includes the steps of:

determining the power supply voltage to generate a voltage detection signal;

activating at least one of a precharging circuit, a word line driving circuit, and the sense amplifier circuit at a first timing of timings corresponding to the at least circuit in accordance with the voltage detection signal and activating the remaining circuits at a second timing later than the first timing;

by the activated word line driving circuit, selecting one of word lines and one of pairs of bit lines in accordance with an input address, and selectively driving the selected word line to one of a power supply voltage and a boosted voltage in accordance with the voltage detection signal, the boosted voltage being higher than the power supply voltage, a memory cell array which is composed of a plurality of memory cells arranged in a matrix manner, wherein each of rows of the memory cell array is connected to a word line and each of columns of the memory cell array is connected to a pair of bit lines;

precharging the selected pair of bit lines by the activated precharge circuit;

amplifying potentials on the bit lines of the selected pair and outputting the amplifying result as a data stored in a memory cell associated with the selected word line and the selected pair of bit lines.

DESCRIPTION OF THE PREFERRED EMBODIMENTS

A semiconductor memory device of the present invention will be described below in detail with reference to the drawings, taking an SRAM an example.

Figure 6:
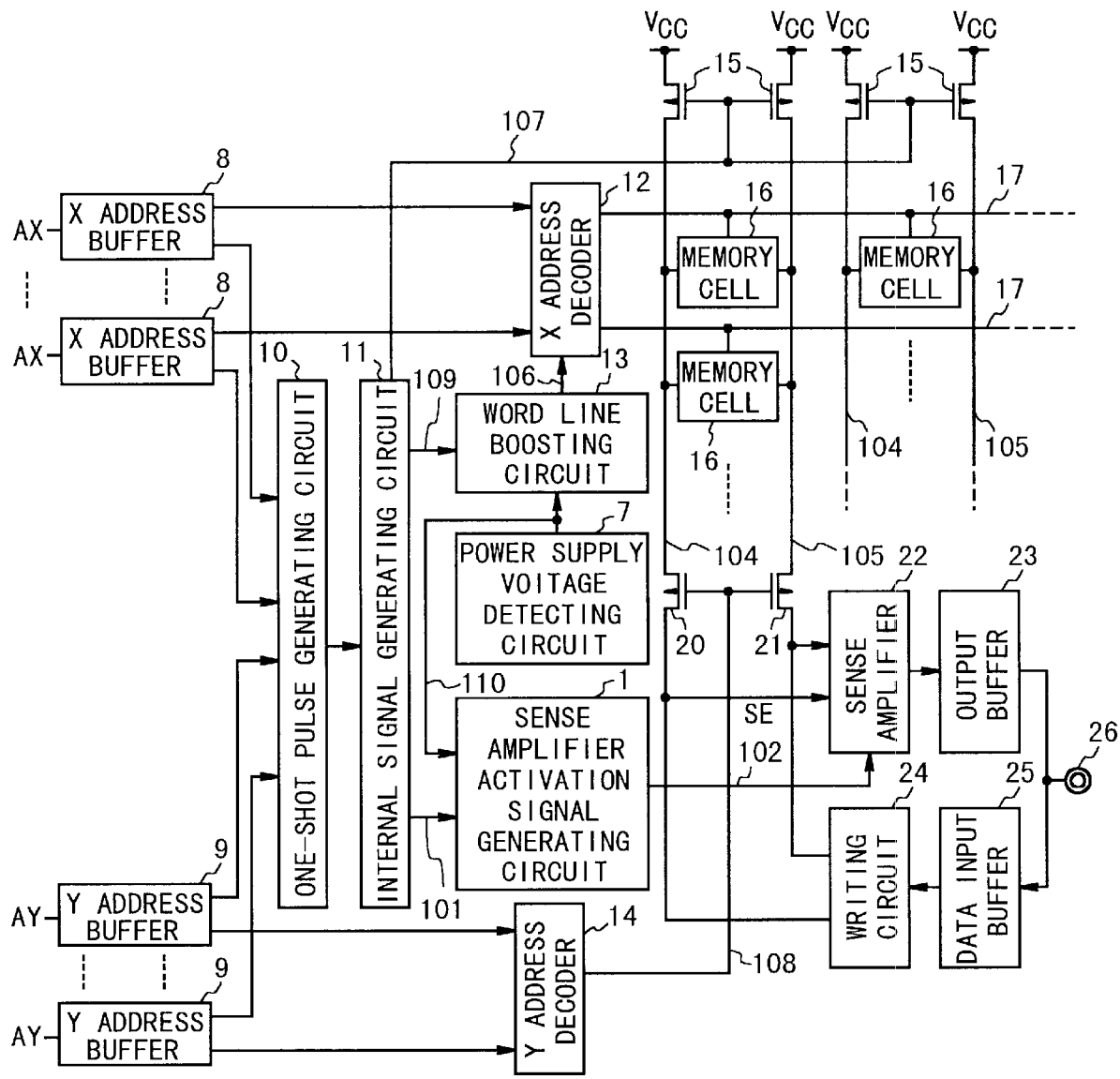
FIG. 6 is a block diagram illustrating the structure of an SRAM according to the first embodiment of the present invention.
Figure 7:
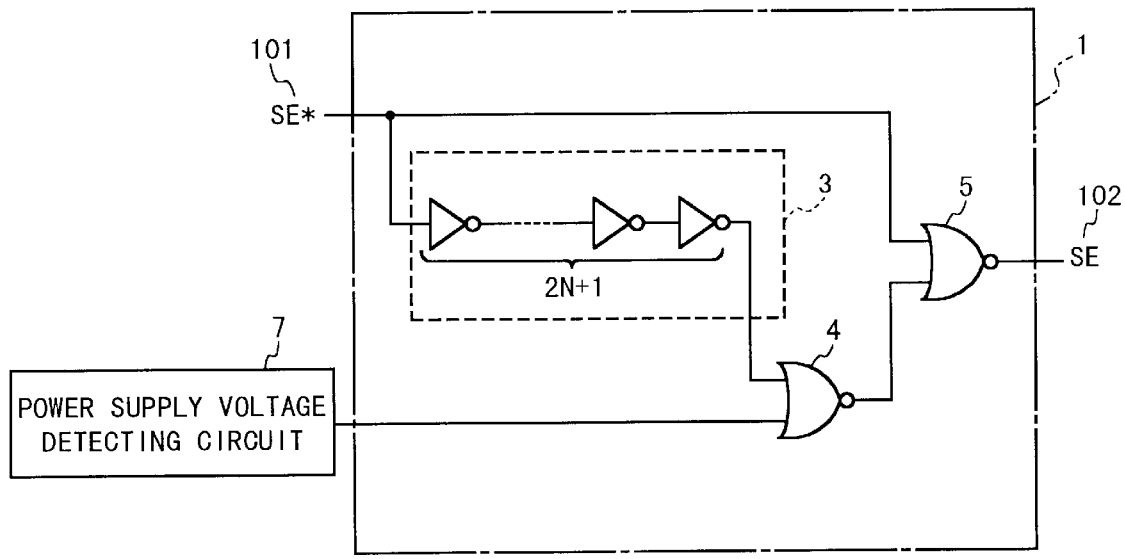
FIG. 7 is a circuit diagram of a sense amplifier activation signal generating circuit of the SRAM according to the embodiment of the present invention.

FIG. 6 is a block diagram illustrating the structure of the SRAM according to an embodiment of the present invention and FIG. 7 is a circuit diagram of a sense amplifier activation signal generating circuit 1 shown in FIG. 6. Referring to FIG. 6, the SRAM is composed of X address buffers 8, an X address decoder 12, Y address buffers 9, an Y address decoder 14, a one-shot pulse generating circuit 10, an internal signal generating circuit 11, a word line boosting circuit 13, a power supply voltage detecting circuit 7, a sense amplifier activation signal generating circuit 1, a sense amplifier 22, an output buffer 23, a data input buffer 25, a writing circuit 24, a static type memory cell array and so on.

In the memory cell array, memory cells 16 are arranged in a matrix manner. Each of columns of the memory cell array is connected to a corresponding pair of complementary bit lines 18 and 19 and each of rows of the memory cell array is connected to a corresponding word line 17. The X address decoder 12 receives X address signals AX from the X address buffers 8, and decodes the X address signals AX to selectively activate one of the word lines 17. On the other hand, the Y address decoder 14 receives Y address signals AY from the Y address buffers 9, and decodes the Y address signals AY to selectively activate one of the output lines. The bit lines 18 and 19 of each pair are connected to the sense amplifier 22 and the writing circuit 24 respectively through transfer gates 20 and 21. The gates of the transfer gates 20 and 21 are together connected to an output of the Y address decoder 14 and are turned on by the Y address decoder 14. P-channel transistors 15 as load of a pair of bit lines 18 and 19 are set to the conductive state by the precharge signal 107 (which is the low active) from the internal signal generating circuit 11 before the read operation and charge the bit lines 18 and 19 to the power supply voltage.

The one shot pulse generating circuit 10 receives a redetermined bits of each of the X address signals AX from the X address buffers 8 and a predetermined bits of each of the Y address signals AY from the Y address buffers 9 to generate a one-shot pulse signal. The internal signal generating circuit 11 receives the pulse signal supplied from the one-shot pulse generating circuit 10 and generates a precharge signal 107, a sense amplifier activation preliminary signal SE* 101, and a boosting circuit activation signal 109. The power supply voltage detecting circuit 7 determines whether the power supply voltage is equal to or less than a predetermined voltage, e.g., 3 V, to generate an active detection signal 110. The detection signal 110 is supplied to the word line boosting circuit 13 and the sense amplifier activation signal generating circuit 1. The word line boosting circuit 13 is responsive to the boosting circuit activation signal 109 to boost the voltage of a selected word line 17 to the voltage of $(V_{cc}+\alpha)$ through the X address decoder 12 based on the detection signal 110. When the detection signal 110 is not active, the selected word line 17 is set to the power supply voltage by the X address decoder 12. The sense amplifier activation signal generating circuit 1 is responsive to the sense amplifier activation preliminary signal SE* 101 to generate a sense amplifier activation signal SE 102 based on the detection signal 110 from the power supply voltage detecting circuit 7 to supply to the sense amplifier 22.

The sense amplifier 22 amplifies the potential difference between the bit lines 18 and 19 to output to the external input/output pin 26 through the output buffer 23 in response to the activation signal SE 102 from the sense amplifier activation signal generating circuit 1 in the read operation. On the other hand, the writing circuit 24 sets one of the bit lines 18 and 19 to the logic high level and the other to the low level based on a writing data which is supplied through the data input buffer 25 from the external input/output pin 26 in the write operation.

Figure 1:
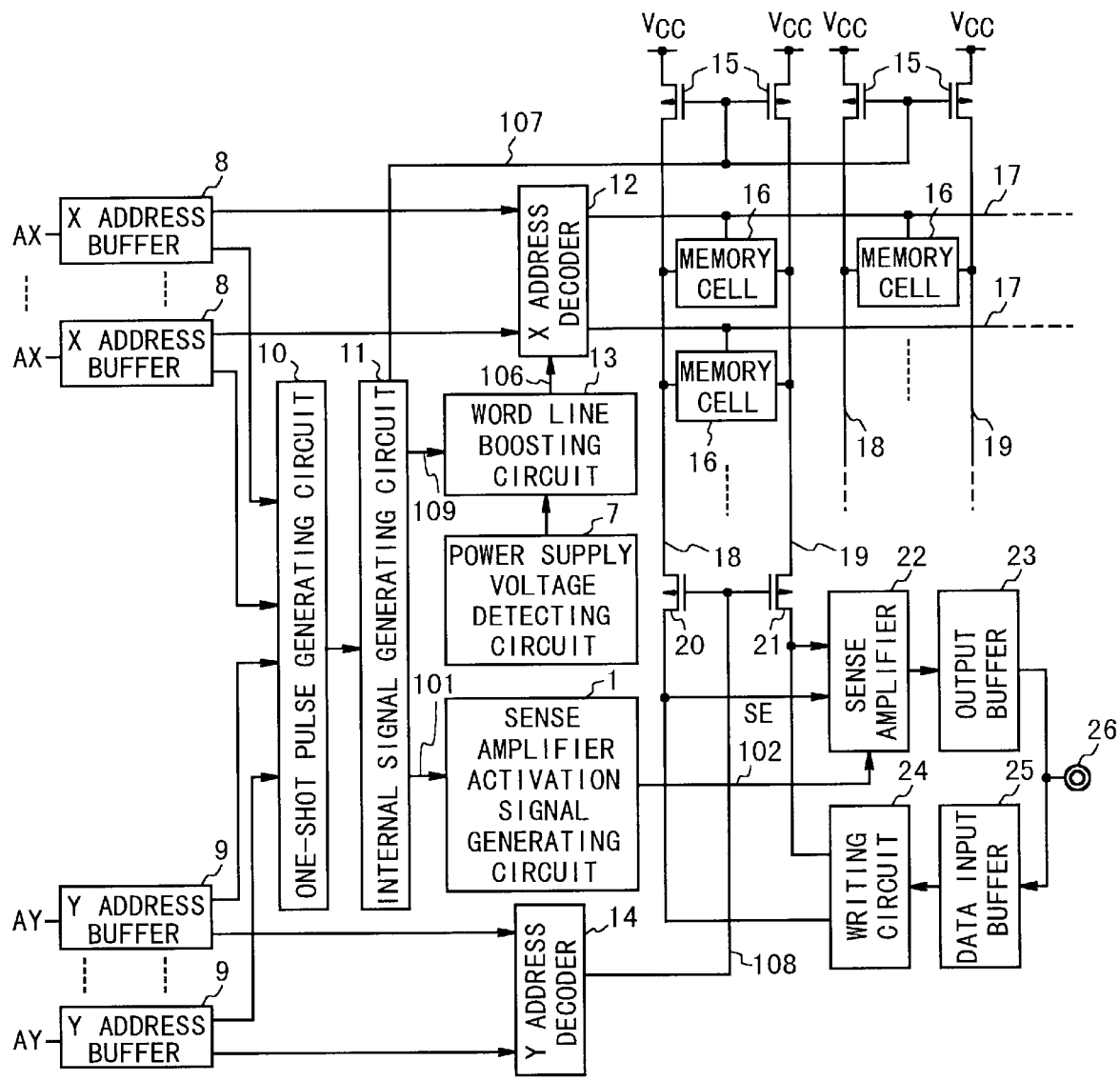
FIG. 1 is a block diagram which shows the structure of an example of conventional SRAM.
Figure 2:
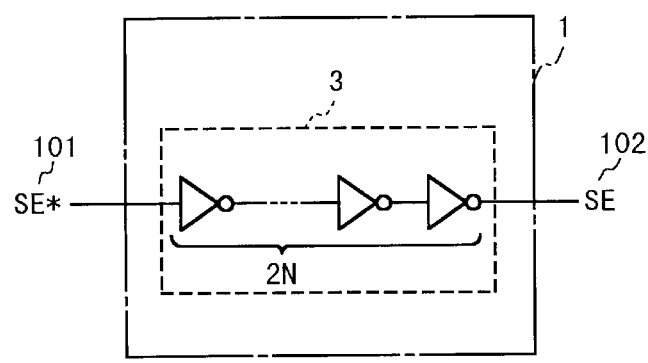
FIG. 2 is a circuit diagram of a sense amplifier activation signal generating circuit in the conventional SRAM shown in FIG. 1.
Figure 3A:
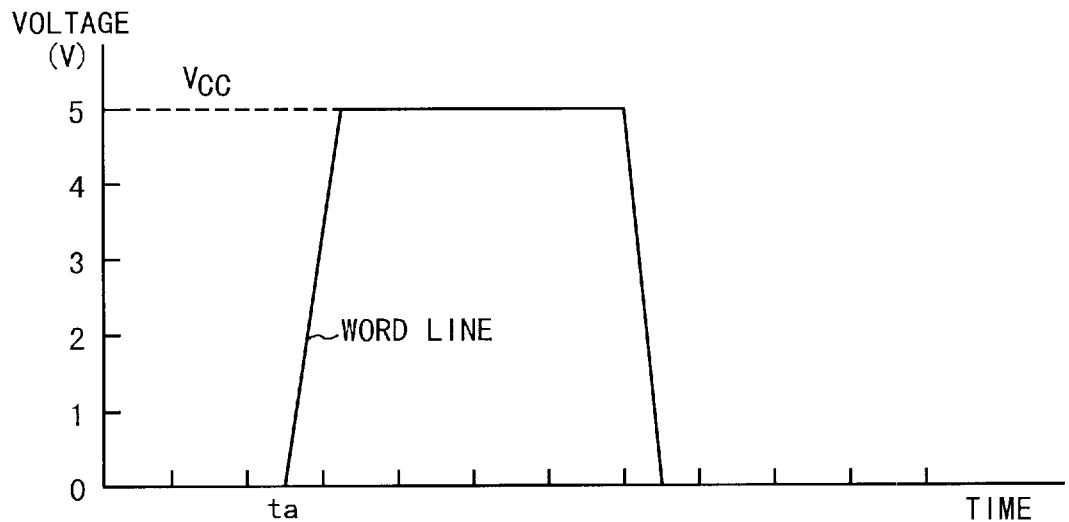
FIG. 3A is a timing chart illustrating the voltage waveform of the word line when the power supply voltage is 5 V in the conventional SRAM and FIG. 3B is a timing chart illustrating the waveform of the potential difference between bit lines of a pair and the waveform of a sense amplifier activation signal at that time.
Figure 3B:
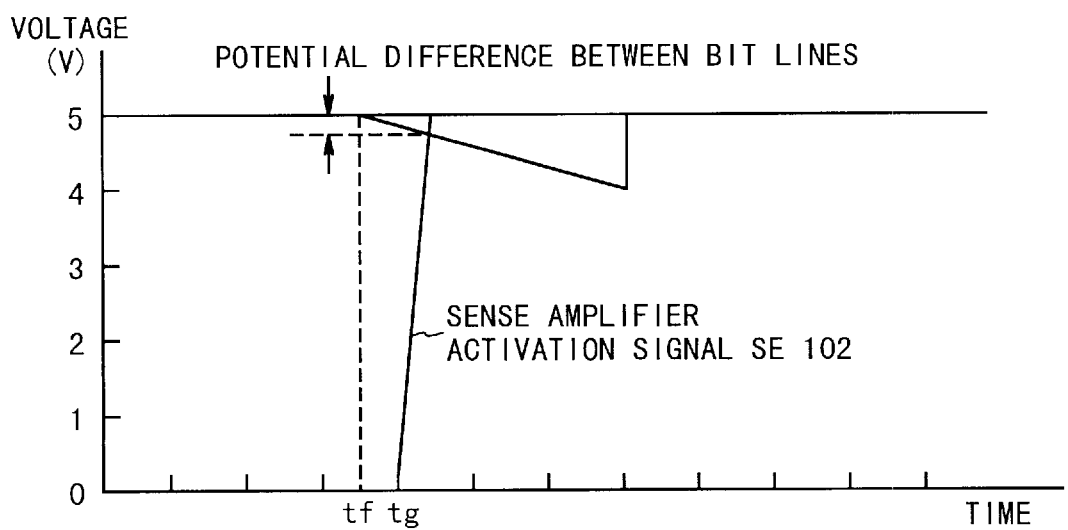
Figure 4A:
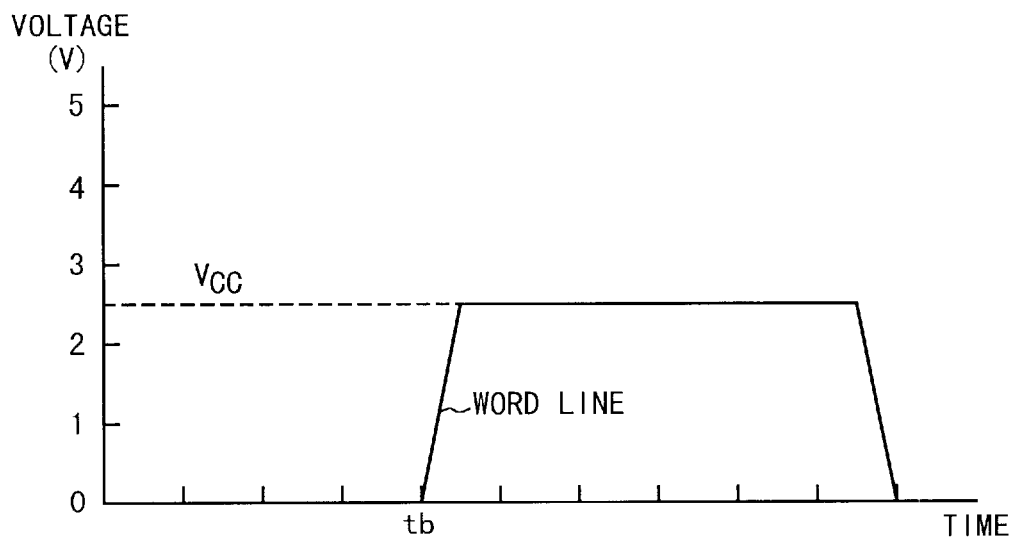
FIG. 4A is a timing chart illustrating the voltage waveform of the word line when the power supply voltage is 2.5 V in the conventional SRAM
Figure 4B:
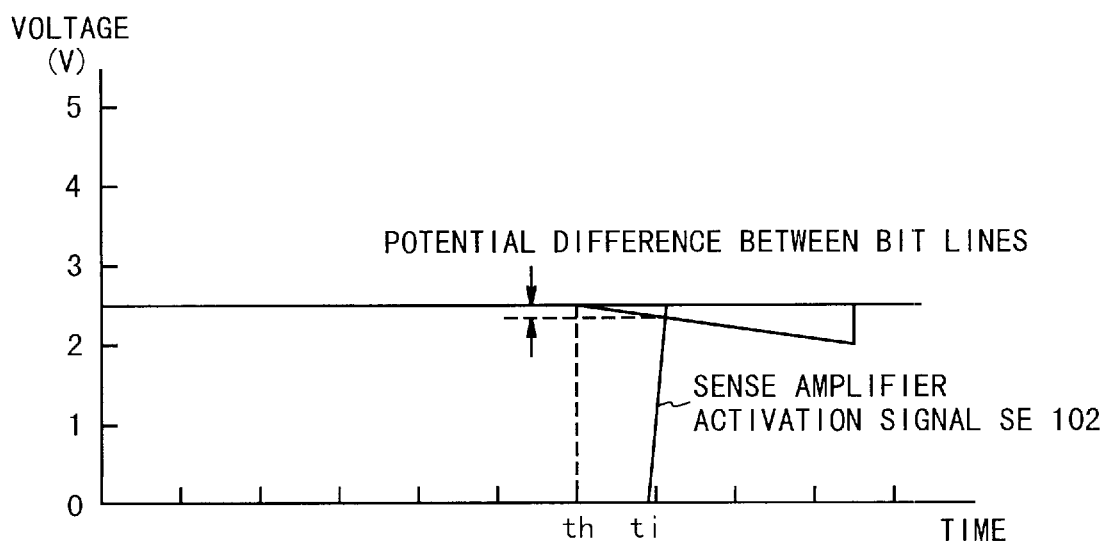
FIG. 4B is a timing chart illustrating the waveform of the potential difference between bit lines of a pair and the waveform of a sense amplifier activation signal at that time.
Figure 5A:
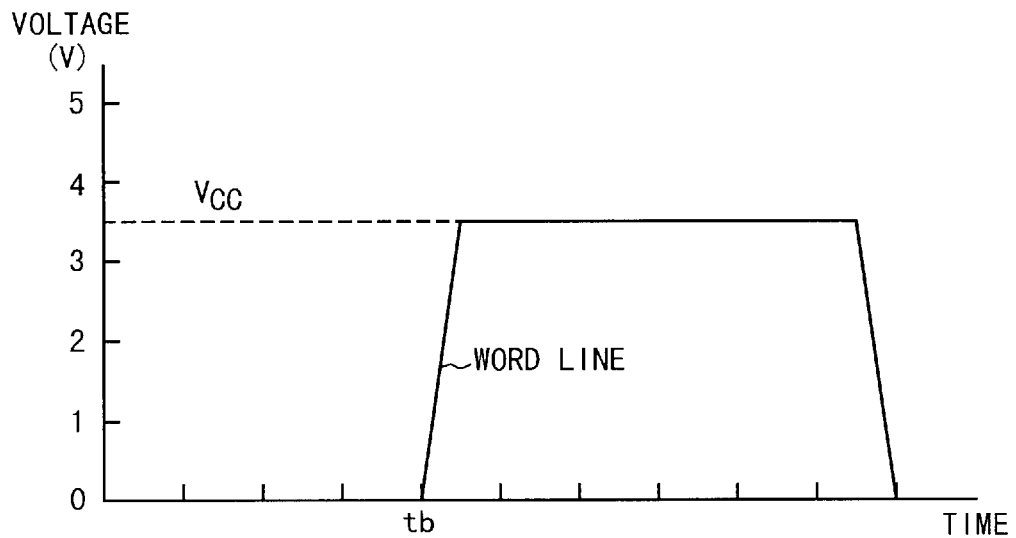
FIG. 5A is a timing chart illustrating the voltage waveform of the word line in the conventional SRAM when the power supply voltage is 2.5 V and a word line boosting circuit is used.
Figure 5B:
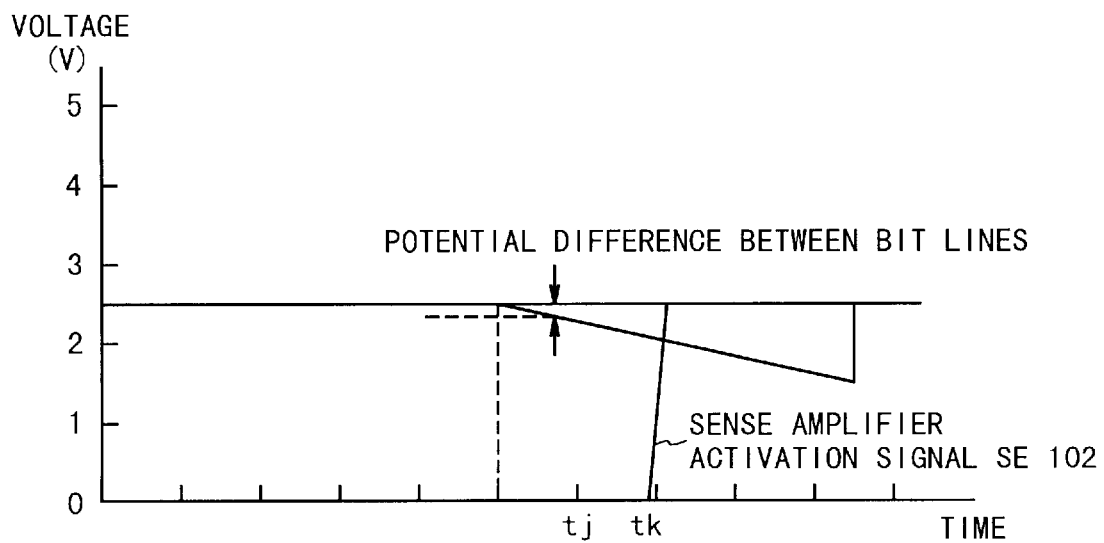
FIG. 5B is a timing chart illustrating the waveform of the potential difference between bit lines of a pair and the waveform of a sense amplifier activation signal at that time.

The SRAM of the present invention shown in FIG. 6 is different from the above-mentioned conventional SRAM shown in FIG. 1 in the following point. That is, in the conventional SRAM, the detection signal 110 is supplied from the power supply voltage detection circuit 7 only to the word line boosting circuit 13. However, in the present invention, the detection signal 110 is supplied to both of the word line boosting circuit 13 and the sense amplifier activation signal generating circuit 1. The structure except it is the same as the conventional example.

FIG. 7 is a circuit diagram illustrating the structure of the sense amplifier activation signal generating circuit 1. Referring to FIG. 7, the sense amplifier activation signal generating circuit 1 is composed of (2N+1) inverters as a delay circuit 3 and two 2-input NOR gates 4 and 5. The delay circuit 3 delays the input signal SE* 101 by a predetermined time period, like the conventional example. The sense amplifier activation preliminary signal SE* 101 is supplied to the delay circuit 3 and one of the input terminals of the NOR gate 5 from the internal signal generating circuit 11. The output signal of the delay circuit 3 is supplied to one of the input terminals of the NOR gate 4. The detection signal 110 is supplied from the power supply voltage detecting circuit 7 to the other input terminal of the NOR gate 4. The output of NOR gate 4 is supplied to the other input terminal of the NOR gate 5. The output of the NOR gate 5 is outputted as the sense amplifier activation signal SE 102.

Figure 8:
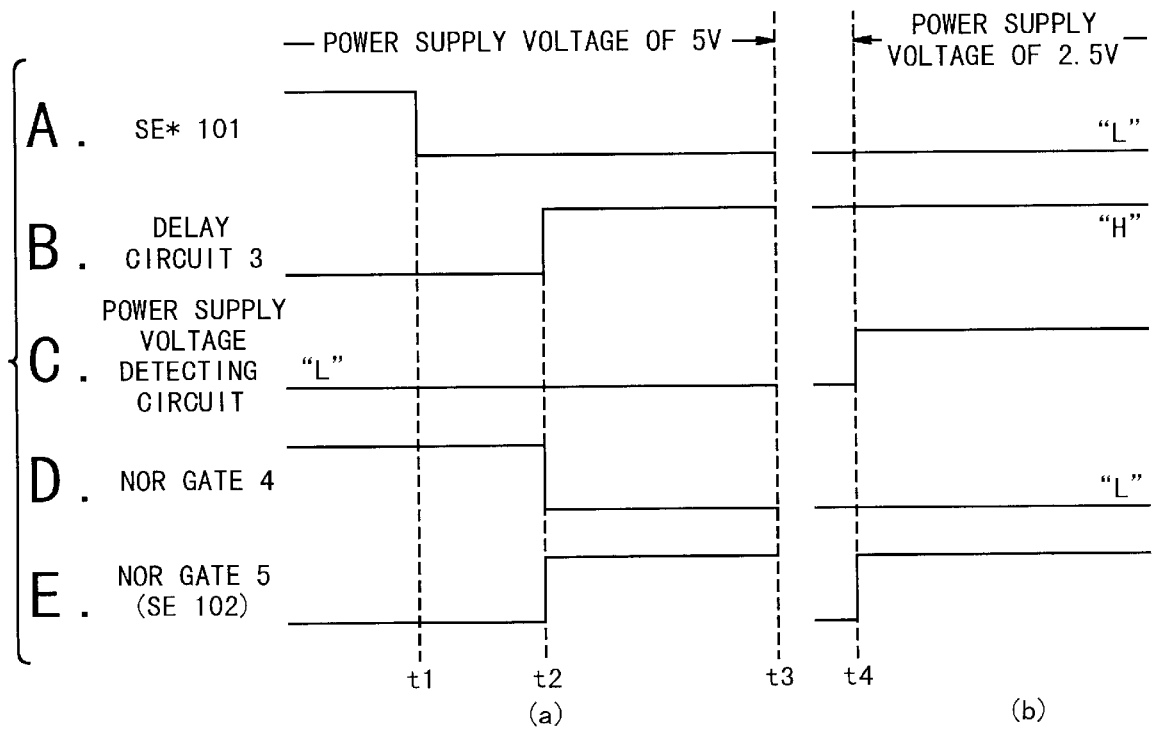
FIGS. 8A to 8E are timing charts to explain the operation of the sense amplifier activation signal generating circuit in case of the power supply voltage of 5 V and the power supply voltage of 2.5 V.

Next, in the above-mentioned structure, the case where the power supply voltage $V_{cc}$ is 5 V as in the general operation voltage and the sense amplifier is activated to read data will be described below. FIGS. 8A to 8E are timing charts illustrating the waveforms of various points in the sense amplifier activation signal generating circuit 1. Referring to FIGS. 8A and 8E, first, the sense amplifier activation preliminary signal SE* 101 is supplied from the internal signal generating circuit 11 to the sense amplifier activation signal generating circuit 1 as a signal of the low level at a timing t1, as shown in FIG. 8A, and is received at one of the input terminals of the NOR gate 5. At the same time, the signal SE* 101 is supplied to the delay circuit 3. The signal SE* 101 is outputted as an inverted signal of the high level at a timing t2 after the signal SE* 101 is delayed by the (2N+1) inverters of the delay circuit 3, as shown in FIG. 8B, and is received by one of the input terminals of the NOR gate 4. At this time, since the detection signal 110 of the low level is supplied to the other input terminal of the NOR gate 4 from the power supply voltage detecting circuit 7, as shown in FIG. 8C, the NOR gate 4 inverts the delayed signal to output a signal of the low level to the NOR gate 5 at the timing t2, as shown in FIG. 8D. Since having inputted the low level of the signal SE* 101 to one of the input terminals, the NOR gate 5 outputs the sense amplifier activation signal SE 102 of the high level to the sense amplifier 22 at the same time when the output signal of the low level is inputted from the NOR gate 4, as shown in FIG. 8E.

On the other hand, in a case where the power supply voltage is 2.5 V, the detection signal 110 has been set to the high level. Therefore, the NOR gate always outputs the signal of the low level. As a result, the NOR gate 5 outputs the sense amplifier activation signal SE 102 at the same time as the sense amplifier activation preliminary signal SE* 101. Thus, when the power supply voltage is 2.5 V, the delay circuit 3 is inhibited not to function.

Figure 9A:
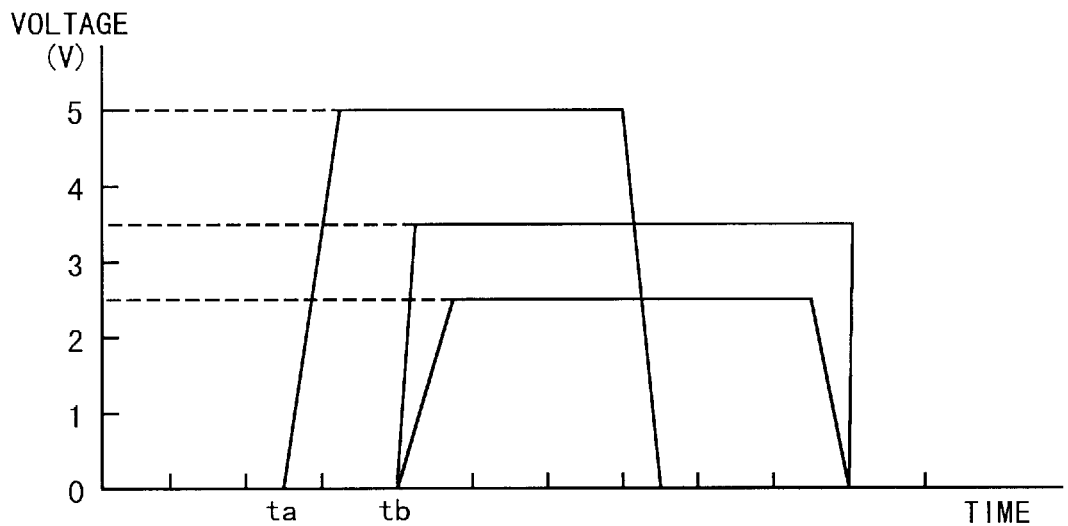
FIG. 9A is a timing chart illustrating the voltage waveform of the word line when the power supply voltage is 5 V and when the word line boosting circuit is used in the power supply voltage of 2.5 V.
Figure 9B:
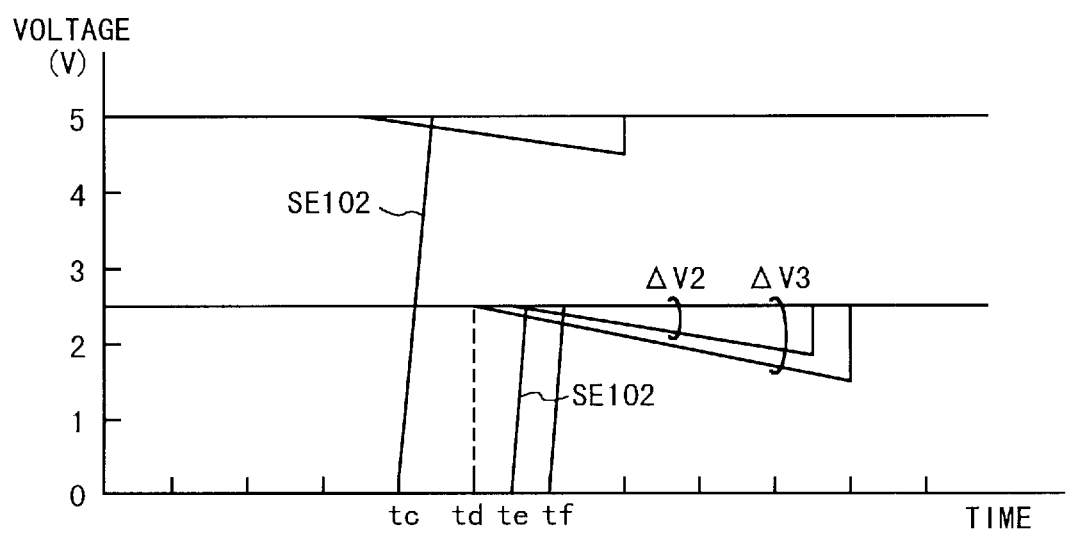
FIG. 9B is a timing chart illustrating the waveform of the potential difference between the bit lines of a pair and the waveform of the sense amplifier activation signal at that time.

FIG. 9A is a timing chart illustrating the voltage waveforms of the word line in the power supply voltages of 5 V and 2.5 V in the present embodiment. FIG. 9B is a timing chart illustrating the waveform of the potential difference between the bit lines 18 and 19 and the waveform of the sense amplifier activation signal at that time. Referring to FIGS. 9A and 9B, first, in the power supply voltage of 5 V, the potential of the word line 17 rises to the high level of 5 V at a timing ta. After a predetermined time period, the potential difference ΔV between the bit lines 18 and 19 is gradually made wide in accordance with the information stored in the memory cell 16. The signal SE 102 is set to the high level at the timing tc when the potential difference has been made wide to the extent required to be correctly amplified by the sense amplifier 22.

On the other hand, when the power supply voltage is equal to or less than 3 V (2.5 V in an example shown in the figure), the drive capability of the transistors is decreased lower than that of the power supply voltage of 5 V as described above. Therefore, even if the word line 17 is selected, the potential of the word line 17 rises to the high level at a timing tb later than the timing ta in the power supply voltage of 5 V. At this time, the word line is boosted to the voltage of ($V_{cc}$+α) which is higher than the power supply voltage of 2.5 V by the word line boosting circuit 13. In this example, the potential of the word line is increased to the voltage of 3.5 V. Thereafter, the potential difference ΔV between of the bit lines 18 and 19 is made gradually wide from a timing td in accordance with the information stored in the memory cell 16. In this case, when the word line boosting circuit 13 is not used the potential difference becomes wide as shown in FIG. 9B by ΔV2. Therefore, the signal SE 102 is set to the high level of 2.5 V at a timing tf. However, in the present embodiment, because the word line boosting circuit 13 is used, the potential difference becomes wide as shown in FIG. 9B by ΔV3. In case of the power supply voltage of 2.5 V, the signal SE 102 can be set to the high level of 2.5 V at the timing te when the potential difference between the bit lines 18 and 19 is made wide to an extent required to be correctly amplified by the sense amplifier 22.

As described above, by adjusting the number of connection stages of the inverters in the delay circuit 3, even if the power supply voltage is in the low voltage equal to or less than 3 V voltage, the signal SE 102 can be set to the high level at the timing te when the potential difference between the bit lines 18 and 19 has become wide to an extent required to be correctly amplified by the sense amplifier 22, and the timing te is earlier than the timing tf in the conventional example. Therefore, the sense amplifier 22 is activated in response to the signal SE 102 and can output the read data to output buffer 23 in the low power supply voltage operation at the time which is earlier than in the conventional example, after the word line 17 is selected and activated.

Figure 10:
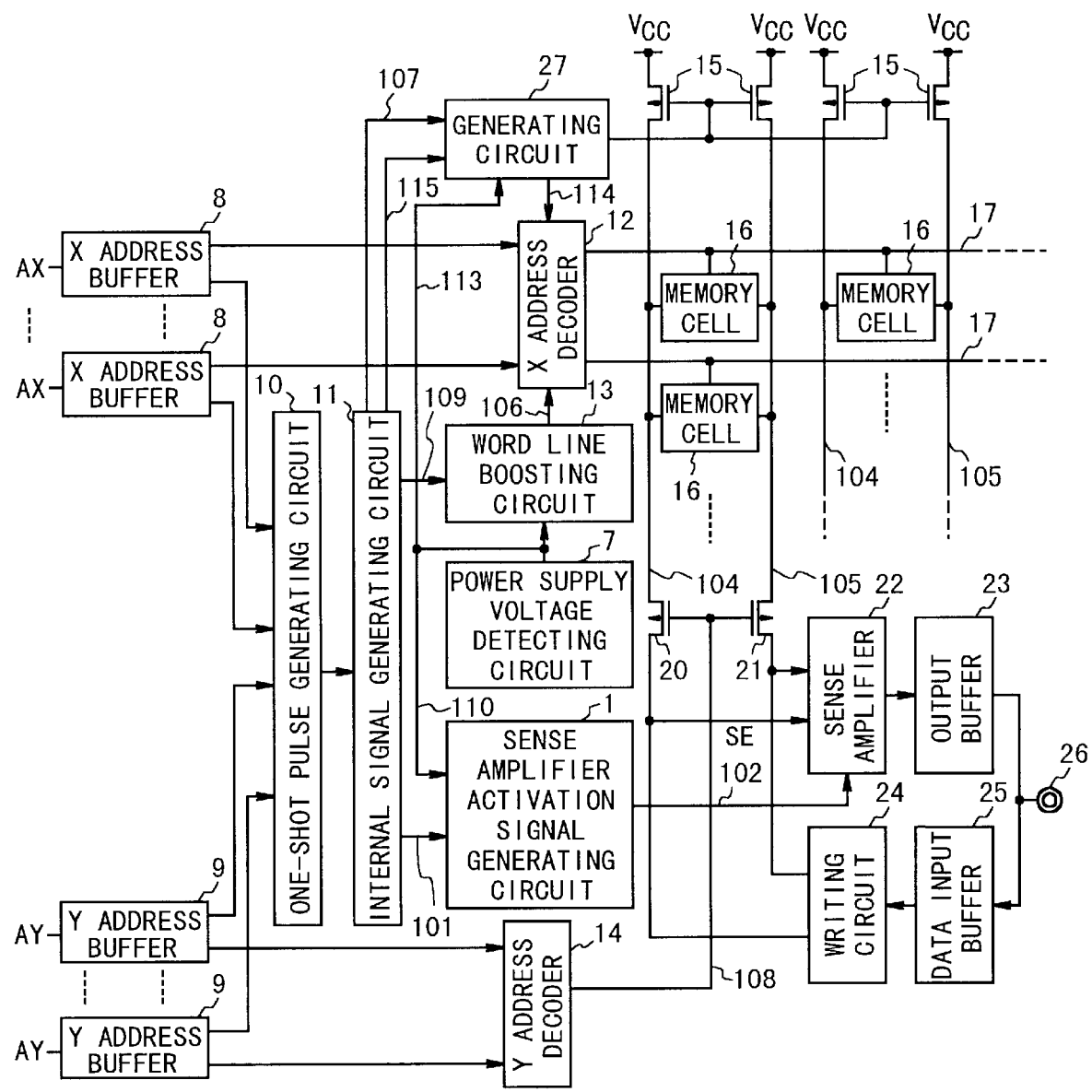
FIG. 10 is a block diagram illustrating the structure of an SRAM according to the second embodiment of the present invention.

Next, the semiconductor memory device according to the second embodiment of the present invention will be described below. FIG. 10 is a block diagram illustrating the structure of the semiconductor memory device in the second embodiment. Referring to FIG. 10, the structure of the semiconductor memory device in the second embodiment is basically the same as that of the first embodiment. Therefore, only the different points will be described. The internal signal generating circuit 11 generates a word line activation signal 115 (which is omitted from the FIG. 6 for simplicity of the figure) in addition to the precharge signal 107, the boosting circuit activation signal 109, and the sense amplifier activation signal SE 102. Also, the detection signal 110 is supplied to a generating circuit 27 in addition to the sense amplifier activation signal generating circuit 1 and the word line boosting circuit 13. The generating circuit 27 is composed of two circuit sections each of which is constituted in the same manner as the sense amplifier activation signal generating circuit 1. That is, two sets of delay circuit 3 and two NOR gates 4 and 5 are provided for the precharge signal 107 and the word line activation signal 115, respectively. In this manner, the precharge timing and the word line activation timing in the present embodiment are made earlier than those of the conventional example in the low power supply voltage. As a result, the high speed read access is made possible.

In the second embodiment, the boosting the above-mentioned generating circuit is not applied to the circuit activation signal 109. However, the generating circuit may be applied to the circuit activation signal 109.

As described above, according to the semiconductor memory device of the present invention, the sense amplifier activation signal SE which should be generated when the potential difference between the bit lines reaches a predetermined level, is generated in response to the detection signal supplied from the power supply voltage detecting circuit. When the power supply voltage is low, the activation signal is delayed by a predetermined time period such that the generation timing of the signal SE becomes close to the timing in the normal power supply voltage operation. Therefore, generally, in either case of normal power supply voltage operation and low power supply voltage operation, the sense amplifier activation signal can be generated at the timing when the potential difference reaches the level required.

Also, when the word line is boosted in the low voltage operation, the read operation can be performed in a short time such that an excess operation margin is not generated between the timing when the potential difference between the bit lines reaches the required level and the timing when the sense amplifier activation signal is generated.

What is claimed is:

1. A semiconductor memory device comprising:
a memory cell array comprising a plurality of memory cells arranged in a matrix manner, wherein each of rows of said memory cell array is connected to a word line and each of columns of said memory cell array is connected to a pair of bit lines, and wherein one of the word lines and one of the pairs of bit lines are selected in accordance with an address such that one of said plurality of memory cells is selected;
internal signal generating means for generating a first activation signal in response to input of said address;
power supply voltage detecting means for determining whether a power supply voltage is higher than a predetermined voltage and generating a voltage detection signal when said power supply voltage is higher than said predetermined voltage, wherein the selected word line is normally set to said power supply voltage and is set to a boosted voltage in response to said voltage detection signal, the boosted voltage being higher than said power supply voltage;

timing control means for receiving said first activation signal and generating a second activation signal at a timing which is determined based on said voltage detection signal from said power supply voltage detecting means; and
sense amplifier means responsive to said second activation signal, for amplifying potentials on the bit lines associated with the selected memory cell and outputting an amplified result as a data stored in the selected memory cell.

2. A semiconductor memory device according to claim 1, wherein said timing control means generates said second activation signal immediately after receiving said first activation signal when said power supply voltage is not higher than said predetermined voltage, and generates said second activation signal by a predetermined time period after receiving said first activation signal when said power supply voltage is higher than said predetermined voltage.

3. A semiconductor memory device according to claim 2, wherein said timing control means comprises:
a delay circuit for receiving said first activation signal and delaying said first activation signal by said predetermined time period;
a first circuit for deactivating the delayed first activation signal in response to said voltage detection signal; and
a second circuit for receiving said first activation signal and outputting, as said second activation signal, the delayed first activation signal if the delayed first activation signal is active and the received first activation signal if the delayed first activation signal is inactive.

4. A semiconductor memory device comprising:
a memory cell array comprising a plurality of memory cells arranged in a matrix manner, wherein each of rows of said memory cell array is connected to a word line and each of columns of said memory cell array is connected to a pair of bit lines;
bit line pair selecting means for selecting one of the pairs of bit lines in accordance with an address;
precharging means for precharging at least the selected pair of bit lines;
word line driving means for selecting one of the word lines in accordance with the address and selectively driving the selected word line to one of a power supply voltage and a boosted voltage in accordance with a voltage detection signal, the boosted voltage being higher than said power supply voltage;
sense amplifier means for amplifying potentials on the bit lines of the selected pair and outputting an amplified result as a data stored in a memory cell associated with the selected word line and the selected pair of bit lines;
power supply voltage detecting means for determining said power supply voltage to generate said voltage detection signal; and
timing control means for selectively activating at least one of said precharging means, said word line driving means, and said sense amplifier means at a corresponding first timing in accordance with said voltage detection signal, remaining of said precharging means, said word line driving means, and said sense amplifier means being activated at a corresponding second timing later than said first timing.

5. A semiconductor memory device according to claim 4, wherein said timing control means activates said at least one of said precharging means, said word line driving means, and said sense amplifier means at said first timing when said power supply voltage is not higher than a predetermined voltage, and at said second timing when said power supply voltage is higher than said predetermined voltage, said second timing being later than said first timing.

6. A semiconductor memory device according to claim 4, wherein said timing control means comprises internal signal generating means for generating a first activation signal in response to input of said address, and wherein said timing control means receives said first activation signal and generates a second activation signal at one of said first timing and said second timing in accordance with said voltage detection signal, and wherein said sense amplifier means is responsive to said second activation signal to amplify potentials on the bit lines of the selected pair and to output an amplified result as a data stored in the selected memory cell.

7. A semiconductor memory device according to claim 6, wherein said timing control means generates said second activation signal immediately after receiving said first activation signal when said power supply voltage is not higher than said predetermined voltage, and generates said second activation signal after receiving said first activation signal by a predetermined time period when said power supply voltage is higher than said predetermined voltage.

8. A semiconductor memory device according to claim 7, wherein said timing control means comprises:

a delay circuit for receiving said first activation signal and delaying said first activation signal by said predetermined time period;

a first circuit for deactivating the delayed first activation signal in response to said voltage detection signal; and a second circuit for receiving said first activation signal and outputting, as said second activation signal, the delayed first activation signal if the delayed first activation signal is active and the received first activation signal if the delayed first activation signal is inactive.

9. A semiconductor memory device according to claim 4, wherein said timing control means comprises internal signal generating means for generating a first activation signal in response to input of said address, and wherein said timing control means receives said first activation signal and generates a second activation signal at one of said first timing and said second timing in accordance with said voltage detection signal, and wherein said precharging means is responsive to said second activation signal to precharge at least the selected pair of bit lines.

10. A semiconductor memory device according to claim 9, wherein said timing control means generates said second activation signal immediately after receiving said first activation signal when said power supply voltage is not higher than said predetermined voltage, and generates said second activation signal after receiving said first activation signal by a predetermined time period when said power supply voltage is higher than said predetermined voltage.

11. A semiconductor memory device according to claim 10, wherein said timing control means comprises:

a delay circuit for receiving said first activation signal and delaying said first activation signal by said predetermined time period;

a first circuit for deactivating the delayed first activation signal in response to said voltage detection signal; and a second circuit for receiving said first activation signal and outputting, as said second activation signal, the delayed first activation signal if the delayed first activation signal is active and the received first activation signal if the delayed first activation signal is inactive.

12. A semiconductor memory device according to claim 4, wherein said timing control means comprises internal signal generating means for generating a first activation signal in response to input of said address, and wherein said timing control means receives said first activation signal and generates a second activation signal at one of said first timing and said second timing in accordance with said voltage detection signal, and wherein said word line driving means is responsive to said second activation signal to select one of the word lines in accordance with the address and selectively driving the selected word line to one of a power supply voltage and a boosted voltage in accordance with said voltage detection signal.

13. A semiconductor memory device according to claim 12, wherein said timing control means generates said second activation signal immediately after receiving said first activation signal when said power supply voltage is not higher than said predetermined voltage, and generates said second activation signal after receiving said first activation signal by a predetermined time period when said power supply voltage is higher than said predetermined voltage.

14. A semiconductor memory device according to claim 13, wherein said timing control means comprises a delay circuit for receiving said first activation signal and delaying said first activation signal by said predetermined time period;

a first circuit for deactivating the delayed first activation signal in response to said voltage detection signal; and a second circuit for receiving said first activation signal and outputting, as said second activation signal, the delayed first activation signal if the delayed first activation signal is active and the received first activation signal if the delayed first activation signal is inactive.

15. A method of accessing a semiconductor memory device, comprising the steps of:

determining said power supply voltage to generate a detection signal;

activating at least one of a precharging circuit, a word line driving circuit, and said sense amplifier circuit at a first timing in accordance with said voltage detection signal and activating remaining ones of said precharging circuit, said word line driving circuit, and said sense amplifier circuit at a second timing later than the first timing;

by the activated word line driving circuit, selecting one of word lines and one of pairs of bit lines in accordance with an input address, and selectively driving the selected word line to one of a power supply voltage and a boosted voltage in accordance with the voltage detection signal, the boosted voltage being higher than said power supply voltage, wherein each of rows of a memory cell array is connected to a word line and each of columns of said memory cell array is connected to a pair of bit lines;

precharging the selected pair of bit lines by the activated precharge circuit; and amplifying potentials on the bit lines of the selected pair of bit lines and outputting an amplified result as a data stored in a memory cell associated with the selected word line and the selected pair of bit lines.

16. A method according to claim 15, wherein said activating step comprises activating said at least one of said precharging circuit, said word line driving circuit, and said sense amplifier circuit at said first timing when said power supply voltage is not higher than a predetermined voltage, and activating remaining ones of said precharging circuit, said word line driving circuit, and said sense amplifier circuit at said second timing when said power supply voltage is higher than said predetermined voltage.

* * * * *